(12) United States Patent
Dohi et al.

(10) Patent No.: US 9,589,877 B2
(45) Date of Patent: Mar. 7, 2017

(54) SEMICONDUCTOR DEVICE AND METHOD FOR MANUFACTURING THE SAME

(71) Applicant: Panasonic Corporation, Osaka (JP)

(72) Inventors: Shigefumi Dohi, Shiga (JP); Kiyomi Hagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 200 days.

(21) Appl. No.: 14/149,886

(22) Filed: Jan. 8, 2014

(65) Prior Publication Data

US 2014/0117542 A1    May 1, 2014

Related U.S. Application Data

(63) Continuation of application No. PCT/JP2012/005359, filed on Aug. 27, 2012.

(30) Foreign Application Priority Data

Oct. 7, 2011    (JP) ................. 2011-222869

(51) Int. Cl.
    *H01L 23/48*    (2006.01)
    *H01L 23/52*    (2006.01)
    (Continued)

(52) U.S. Cl.
    CPC ...... *H01L 23/49811* (2013.01); *H01L 21/563* (2013.01); *H01L 23/49816* (2013.01);
    (Continued)

(58) Field of Classification Search
    CPC . H01L 2224/73265; H01L 2224/32225; H01L 2224/73204; H01L 2224/32245
    See application file for complete search history.

(56) References Cited

U.S. PATENT DOCUMENTS

2006/0163728 A1    7/2006    Nakanishi et al.
2010/0140801 A1*   6/2010    Anbai ................. H01L 23/3171
                                                              257/738
(Continued)

FOREIGN PATENT DOCUMENTS

JP    2004-146728    5/2004
JP    2005-93943     4/2005
(Continued)

OTHER PUBLICATIONS

International Search Report of PCT Application No. PCT/JP2012/005359 dated Sep. 25, 2012.

*Primary Examiner* — Zandra Smith
*Assistant Examiner* — John M Parker
(74) *Attorney, Agent, or Firm* — Panasonic IP Management; Kerry S. Culpepper

(57) ABSTRACT

A semiconductor device includes an expanded semiconductor chip having a first semiconductor chip and an expanded portion extending outward from a side surface of the first semiconductor chip, a second semiconductor chip provided so as to be connected to the expanded semiconductor chip via a plurality of first bumps, and a base provided so as to be connected to the expanded semiconductor chip via a plurality of second bumps. The first bumps are provided between the first semiconductor chip and the second semiconductor chip. The second bumps are provided between the expanded portion and the base.

17 Claims, 12 Drawing Sheets

(51) Int. Cl.
*H01L 29/40* (2006.01)
*H01L 23/498* (2006.01)
*H01L 25/18* (2006.01)
*H01L 21/56* (2006.01)
*H01L 23/538* (2006.01)
*H01L 23/00* (2006.01)
*H01L 25/03* (2006.01)

(52) U.S. Cl.
CPC .......... *H01L 23/5389* (2013.01); *H01L 24/81* (2013.01); *H01L 25/03* (2013.01); *H01L 25/18* (2013.01); *H01L 2224/16225* (2013.01); *H01L 2224/32225* (2013.01); *H01L 2224/73204* (2013.01); *H01L 2225/06513* (2013.01); *H01L 2225/06517* (2013.01); *H01L 2225/06527* (2013.01)

(56) References Cited

U.S. PATENT DOCUMENTS

| | | | | |
|---|---|---|---|---|
| 2010/0314780 | A1* | 12/2010 | Camacho | H01L 21/561 257/777 |
| 2012/0038044 | A1* | 2/2012 | Chang | H01L 24/19 257/738 |
| 2014/0103544 | A1* | 4/2014 | Yokoyama | H01L 24/17 257/777 |
| 2014/0124941 | A1* | 5/2014 | Sakamoto | H01L 25/0657 257/773 |

FOREIGN PATENT DOCUMENTS

| | | |
|---|---|---|
| JP | 2006-203079 | 8/2006 |
| JP | 2007-53395 | 3/2007 |

* cited by examiner

SEMICONDUCTOR DEVICE AND METHOD FOR MANUFACTURING THE SAME

CROSS-REFERENCE TO RELATED APPLICATIONS

This is a continuation of International Application No. PCT/JP2012/005359 filed on Aug. 27, 2012, which claims priority to Japanese Patent Application No. 2011-222869 filed on Oct. 7, 2011. The entire disclosures of these applications are incorporated by reference herein.

BACKGROUND

The present disclosure relates to semiconductor devices and methods for manufacturing the semiconductor devices, and specifically relates to semiconductor devices including a chip-on-chip structure in which a plurality of semiconductor chips are stacked with each other, and methods for manufacturing the semiconductor devices.

In systems such as digital televisions and recorders, data amount to be processed has been significantly increasing with increased functionality. The capacity of semiconductor memories mounted on the systems is accordingly increasing. Further, semiconductor memories with high data transfer rate have been demanded. Semiconductor devices in which a logic circuit including a memory controller and a memory are integrally mounted have been developed so that a lot of semiconductor memories can be mounted on the system.

Techniques of integrally forming a logic circuit and a memory include a system-on-chip (SoC) technique in which a logic circuit chip and a memory chip are integrated on one chip, and a system-in-package (SiP) technique in which a logic circuit chip and a memory chip are stacked with each other and accommodated in one package. According to the SiP technique, the chips can be produced at lower costs, have higher functionality, consume less power, and can be reduced in size and weight, as demanded, and can be flexibly applied to various specifications. Therefore, systems utilizing the SiP structure with relatively low manufacturing cost are now increasing.

The SiP structure is classified into four types according to differences in the structure, i.e., a chip-on-chip (CoC) type, a stacked chip type, a package-on-package type, and a substrate connection type. Among these types, the CoC type has a structure in which a chip is stacked on a base chip, and this structure enables high speed processing due to a short interconnection length between circuits provided at the respective chips.

In conventional CoC semiconductor devices, the technique for connecting chips whose circuit sides face each other includes connection through bumps (see, e.g., Japanese Unexamined Patent Publication No. 2004-146728).

SUMMARY

However, in the conventional semiconductor devices, the stacked chip configuration is limited by the chip size. In the case where a memory chip and a logic circuit chip are stacked with each other, it is necessary to place the memory chip larger in size than the logic circuit chip, above the logic circuit chip smaller in size than the memory chip, considering that these chips are mounted on a base (e.g., a substrate) by flip-chip (FC) connection afterward. Thus, if the logic circuit chip is equivalent to or larger in size than the memory chip, it is impossible to obtain a semiconductor device having a CoC structure by the conventional method.

Using a memory chip larger in size than the logic circuit chip may be one of methods for this problem, but preparing an unnecessarily large memory chip may reduce the number of chips per wafer and increase costs.

The present disclosure is therefore intended to stack semiconductor chips by the chip-on-chip technique with no limitation on size of the semiconductor chips.

To achieve the above objective, a semiconductor device of the present disclosure includes an expanded semiconductor chip having an expanded portion which extends outward from a side surface of a semiconductor chip.

Specifically, a semiconductor device of the present disclosure includes: an expanded semiconductor chip including a first semiconductor chip and an expanded portion which extends outward from a side surface of the first semiconductor chip; a second semiconductor chip provided so as to be connected to the expanded semiconductor chip via a plurality of first bumps; and a base provided so as to be connected to the expanded semiconductor chip via a plurality of second bumps, wherein the first bumps are formed between the first semiconductor chip and the second semiconductor chip, and the second bumps are formed between the expanded portion and the base.

In the semiconductor device of the present disclosure, the first semiconductor chip and the second semiconductor chip can be stacked with each other by CoC connection and can be mounted on the base by FC connection, with no limitation on sizes of the first semiconductor chip and the second semiconductor chip.

Preferably, in the semiconductor device of the present disclosure, the expanded semiconductor chip has a re-distribution interconnect portion extending from a front surface of the first semiconductor chip to a front surface of the expanded portion, and the a first electrode pad to be connected to a corresponding one of the first bumps and a second electrode pad to be connected to a corresponding one of the second bumps are formed in the re-distribution interconnect portion, and the first electrode pad and the second electrode pad are connected to each other via an interconnect formed in the re-distribution interconnect portion.

In the semiconductor device of the present disclosure, a length of each side of the front surface of the expanded semiconductor chip is preferably longer than a length of each side of a front surface of the second semiconductor chip.

In the semiconductor device of the present disclosure, the expanded portion may be made of a resin material covering the side surface of the first semiconductor chip.

Preferably, in the semiconductor device of the present disclosure, the second semiconductor chip includes a third electrode pad connected to a corresponding one of the first bumps, the base includes a fourth electrode pad connected to a corresponding one of the second bumps, and a sum of thicknesses of the second electrode pad, the corresponding one of the second bumps, and the fourth electrode pad is larger than a sum of thicknesses of the first electrode pad, the corresponding one of the first bumps, the third electrode pad, and the second semiconductor chip.

In the semiconductor device of the present disclosure, the second electrode pad may be thicker than the first electrode pad.

In the semiconductor device of the present disclosure, the thickness of the fourth electrode pad is preferably greater at least than a difference between a sum of the thickness of the second electrode pad and the thickness of the corresponding one of the second bump, and the thickness of the second semiconductor chip.

Preferably, in the semiconductor device of the present disclosure, the base has a plurality of external terminals on a surface opposite to a surface facing the expanded semiconductor chip, and a distance between adjacent ones of the second bumps is greater than a distance between adjacent ones of the first bumps, and is smaller than a distance between adjacent ones of the external terminals.

In the semiconductor device of the present disclosure, a groove may be formed in a region of the base where the second semiconductor chip overlaps, in a surface facing the second semiconductor chip.

In the semiconductor device of the present disclosure, the second semiconductor chip may be a stacked-type semiconductor chip including a plurality of semiconductor chips stacked one another, and the stacked semiconductor chips may be connected with one another by a through electrode.

A method for manufacturing a semiconductor device of the present disclosure includes: preparing an expanded semiconductor chip including a first semiconductor chip and an expanded portion provided on a side surface of the first semiconductor chip, a second semiconductor chip, and a base; forming a plurality of first bumps on the first semiconductor chip of the expanded semiconductor chip, and providing a chip-on-chip connection between the first semiconductor chip and the second semiconductor chip via the first bumps, and forming a plurality of second bumps on the expanded portion of the expanded semiconductor chip, and providing a connection between the expanded portion and the base via the second bumps.

In the method for manufacturing a semiconductor device of the present disclosure, the first semiconductor chip and the second semiconductor chip can be stacked with each other by CoC connection and can be mounted on the base by FC connection, with no limitation on sizes of the first semiconductor chip and the second semiconductor chip.

As described above, according to the semiconductor device of the present disclosure and the method for manufacturing the semiconductor device, the semiconductor chips can be stacked with each other by chip-on-chip connection and can be mounted on the base by flip-chip connection, with no limitation on size of the semiconductor chips.

DETAILED DESCRIPTION

A semiconductor device of an embodiment of the present disclosure will be described with reference to FIG. 1.

Figure 1:
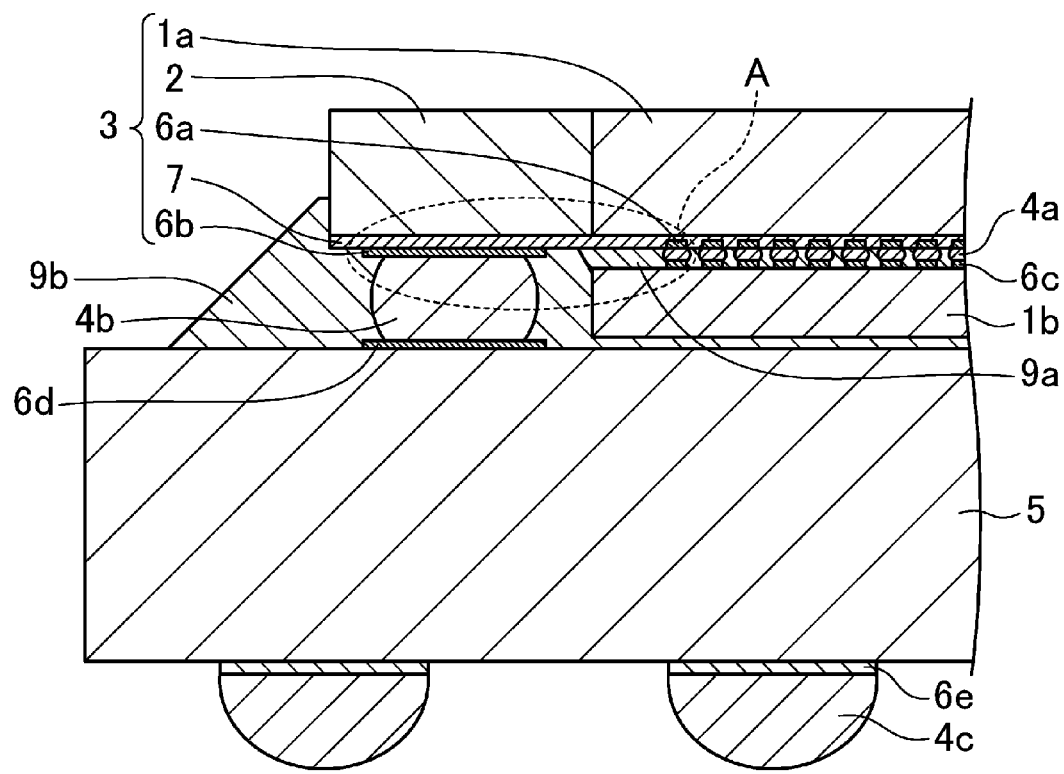
FIG. 1 is a cross-section of a semiconductor device according to an embodiment.

As illustrated in FIG. 1, a semiconductor device of the present embodiment includes: an expanded semiconductor chip 3 having a first semiconductor chip 1a (e.g., a logic circuit chip) and an expanded portion 2; a second semiconductor chip 1b (e.g., a memory chip); and a substrate 5 (i.e., a base) made of resin, etc. In the present embodiment, the substrate 5 is used as a base. However, an interconnect substrate, for example, may also be used as the substrate 5. Further, the base is not limited to the substrate 5 or the interconnect substrate, but a lead frame, for example, may also be used as a base.

The expanded semiconductor chip 3 includes the expanded portion 2 made of resin, for example, and extending outward from a side surface of the first semiconductor chip 1a. A re-distribution interconnect portion 7 including an interconnect (not shown) is provided on a front surface (the lower surface in FIG. 1) of the first semiconductor chip 1a where a circuit is formed. The re-distribution interconnect portion 7 extends to a front surface (the lower surface in FIG. 1) of the expanded portion 2. A plurality of first electrode pads 6a are formed in the re-distribution interconnect portion 7 provided on the front surface of the first semiconductor chip 1a, whereas a plurality of second electrode pads 6b (only one pad 6b is shown in FIG. 1) are formed in the re-distribution interconnect portion 7 provided on the front surface of the expanded portion 2. These structures will be described in detail later. The expanded semiconductor chip 3 is comprised of the first semiconductor chip 1a, the expanded portion 2, the first electrode pads 6a, the second electrode pads 6b, and the re-distribution interconnect portion 7. The expanded portion 2 is formed such that the size of the expanded semiconductor chip 3 in plan view is larger than the size of the second semiconductor chip 1b in plan view. Specifically, the length of each side of a front surface of the expanded semiconductor chip 3 is longer than the length of any side of a front surface of the second semiconductor chip 1b.

A plurality of third electrode pads 6c are provided on the front surface (the upper surface in FIG. 1) of the second semiconductor chip 1b where a circuit is formed. A first bump 4a is formed between each of the third electrode pads 6c and a corresponding one of the first electrode pads 6a provided on the front surface of the first semiconductor chip 1a. The third electrode pad 6c and the first electrode pad 6a are connected to each other via the first bump 4a. Accordingly, the first semiconductor chip 1a of the expanded semiconductor chip 3 and the second semiconductor chip 1b are connected to each other by chip-on-chip (CoC) connection via the re-distribution interconnect portion 7, the first electrode pads 6a, the first bumps 4a, and the third electrode pads 6c. Further, a first underfill 9a is formed between the second semiconductor chip 1b and the expanded semiconductor chip 3 to adhere the second semiconductor chip 1b to the expanded semiconductor chip 3.

A plurality of fourth electrode pads 6d (only one pad 6d is shown in FIG. 1) are provided on a front surface (the upper surface in FIG. 1) of the substrate 5. A second bump 4b is formed between each of the fourth electrode pads 6d and a corresponding one of the second electrode pads 6b provided on the expanded portion 2 of the expanded semiconductor chip 3. The fourth electrode pad 6d and the second electrode pad 6b are connected to each other via the second bump 4b. That is, the expanded semiconductor chip 3 is flip-chip (FC) connected to the substrate 5. The fourth electrode pad 6d on the substrate 5 and the first semiconductor chip 1a are connected via the second bump 4b, the second electrode pad 6b, and the re-distribution interconnect portion 7. A second underfill 9b is formed between the substrate 5 and the expanded semiconductor chip 3 to adhere the expanded semiconductor chip 3 to the substrate 5. In place of the second underfill 9b, the expanded semiconductor chip 3 is encapsulated on the substrate 5 with encapsulant resin.

A plurality of fifth electrode pads 6e are provided on a back surface (the lower surface in FIG. 1) of the substrate 5, and a plurality of third bumps 4c are formed to be connected to a corresponding one of the fifth electrode pads 6e. These elements function as an external terminal for connecting the semiconductor device of the present embodiment to an external device.

Figure 2:
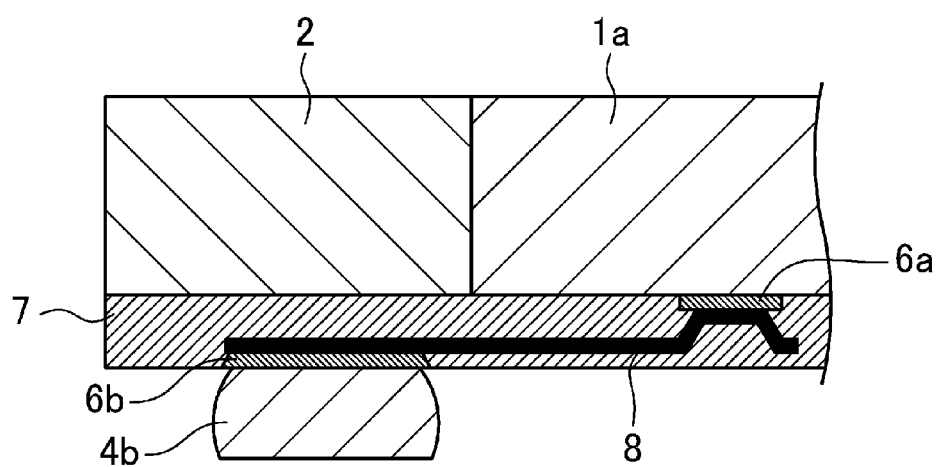
FIG. 2 is an enlarged cross-section of the region A of FIG. 1.

Now, the re-distribution interconnect portion 7 will be described in detail with reference to FIG. 2. In FIG. 2, the second semiconductor chip 1b, the first bumps 4a, the third electrode pads 6c, the first underfill 9a, and the second underfill 9b are not shown.

As illustrated in FIG. 2, the re-distribution interconnect portion 7 is provided on the front surface (the lower surface in FIG. 2) of the first semiconductor chip 1a, and extends to the expanded portion 2. The first electrode pads 6a are formed in the re-distribution interconnect portion 7 to be connected to various elements in the first semiconductor chip 1a. Further, a re-distribution interconnect 8 is formed in the re-distribution interconnect portion 7 and extends from a front surface side of the first semiconductor chip 1a to a front surface side of the expanded portion 2. The second electrode pad 6b is formed in the re-distribution interconnect portion 7 provided on the front surface of the expanded portion 2, and the second bump 4b is provided to be connected to the second electrode pad 6b, as described above. The first electrode pad 6a and the second electrode pad 6b are connected to each other via the re-distribution interconnect 8. Thus, the substrate 5 to which the second bump 4b is connected is capable of being connected to the first semiconductor chip 1a via the second bump 4b without being interrupted by the second semiconductor chip 1b.

In the semiconductor device according to an embodiment of the present disclosure, semiconductor chips can be stacked with each other by CoC connection and mounted on a substrate by FC connection with no limitation on size of the semiconductor chips.

The re-distribution interconnect portion 7 does not need to be provided on the entire front surfaces of the first semiconductor chip 1a and the expanded portion 2. The re-distribution interconnect portion 7 may be provided such that the front surface of the first semiconductor chip 1a at a central portion of the expanded semiconductor chip 3 is exposed, and the second semiconductor chip 1b may be directly mounted on the front surface of the first semiconductor chip 1a without interposing the re-distribution interconnect portion 7 therebetween. Further, although the re-distribution interconnect portion 7 is one layer in FIG. 2, the re-distribution interconnect portion 7 may include a plurality of layers. The provision of the re-distribution interconnect portion 7 on the front surfaces of the first semiconductor chip 1a and the expanded portion 2 as in the present embodiment eliminates the necessity of forming an interconnect layer which connects the first bump 4a and the second bump 4b on the first semiconductor chip 1a. Thus, it is not necessary to use a special semiconductor chip, and a general-purpose semiconductor chip can be used.

As a material for the re-distribution interconnect 8, for example, copper (Cu) or silver (Ag) with which the re-distribution interconnect 8 can be formed at relatively low cost by electroplating is used.

As materials for the first electrode pad 6a, the second electrode pad 6b, the third electrode pad 6c, and the fourth electrode pad 6d, Cu, nickel (Ni), aluminum (Al), a Ni/gold (Au) layered film, an Al/Au layered film, a titanium (Ti)/Ni/Au layered film, or a Ti/Al/Au layered film, etc., is used.

As materials for the first bump 4a, the second bump 4b, and the third bump 4c, tin (Sn)-lead (Pb) based solder, Sn solder, Sn—Ag based solder, Sn—Ag—Cu based solder, or Sn—Ag—Cu—Ni based solder, etc., is used for a highly reliable connection. In addition, for low-temperature solder connection, solder whose melting point is low about 130° C. to 180° C., such as Sn-bismuth (Bi) based solder, Sn—Bi—Ag based solder, Sn—Bi-indium (In) based solder, Sn—Bi—In—Ag based solder, Sn—In based solder, or Sn—In—Ag based solder, etc., may also be used. Further, as materials for the first bump 4a and the second bump 4b, Au, Ni or Cu, etc., may also be used. Using these materials enables the chip and the substrate to be connected at low temperature by pressure welding them under high pressure conditions.

The first electrode pad 6a and the second electrode pad 6b may be made of the same metal material, and the first bump 4a and the second bump 4b may be made of the same metal material. In this configuration, the first electrode pad 6a and the second electrode pad 6b can be formed using the same mask, and the first bump 4a and the second bump 4b can be formed using the same mask, and the costs can be accordingly reduced.

The expanded portion 2 may be formed to cover the side surface of the first semiconductor chip 1a, and also may be formed to cover not only the side surface, but also at least the upper or lower surface of the first semiconductor chip 1a.

Preferably, the substrate 5 is made of resin that is flexible and strong against bending. Using the substrate 5 made of such resin is advantageous in electrically connecting a semiconductor package and a semiconductor chip. In this case, the substrate 5 may cover the entire surface of the semiconductor chip, or may be partially cover the semiconductor chip. Further, the substrate 5 made of resin may be replaced with a lead frame. Thus, the semiconductor device can be manufactured using low cost materials.

Now, a method for manufacturing the semiconductor device according to one embodiment of the present disclosure will be described with reference to FIG. 3 to FIG. 9.

Figure 3A:
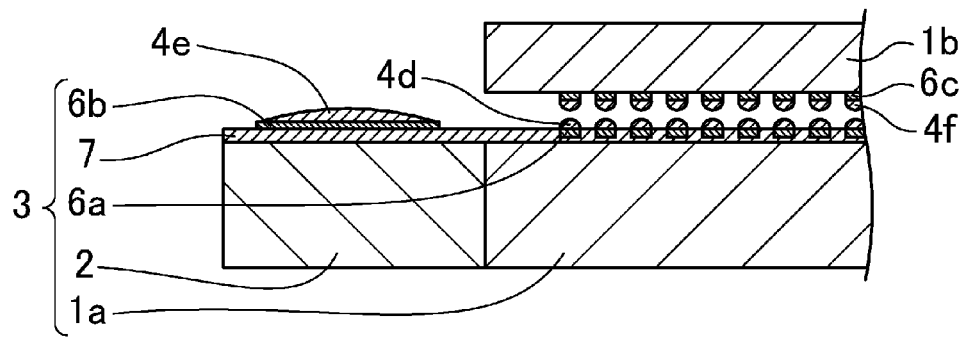
FIG. 3A to FIG. 3C are cross-sections illustrating a method for manufacturing the semiconductor device of the embodiment in the order of steps.

First, as illustrated in FIG. 3A, an expanded semiconductor chip 3 and a second semiconductor chip 1b that is a memory chip are prepared. To form the expanded semiconductor chip 3, an expanded portion 2 made of resin, for example, is formed in advance on a side surface of a first semiconductor chip 1a that is a logic circuit chip. Further, a re-distribution interconnect portion 7 to be connected to an element formed in the first semiconductor chip 1a is formed on front surfaces (upper surfaces in FIG. 3A) of the first semiconductor chip 1a and the expanded portion 2. A plurality of first electrode pads 6a and a plurality of fourth bumps 4d are sequentially formed on the re-distribution interconnect portion 7 formed on the front surface of the first semiconductor chip 1a, whereas a plurality of second electrode pads 6b and a plurality of fifth bump 4e (only one pad 6b and one bump 4e are shown in FIG. 3A) are sequentially formed on the re-distribution interconnect portion 7 formed on the front surface of the expanded portion 2. These elements comprise the expanded semiconductor chip 3. A plurality of third electrode pads 6c and a plurality of sixth bumps 4f are sequentially formed on a front surface (the lower surface in FIG. 3A) of the second semiconductor chip 1b where a circuit is formed.

Figure 3B:
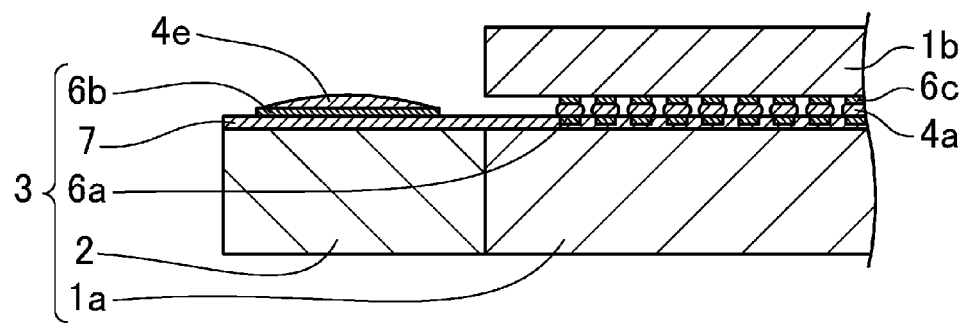

Next, as illustrated in FIG. 3B, the sixth bumps 4f formed on the second semiconductor chip 1b and the fourth bumps 4d formed on the expanded semiconductor chip 3 are connected together by heating, e.g., reflow heating or local heating, or pressure welding, thereby forming a plurality of first bumps 4a. Thus, the first semiconductor chip 1a of the expanded semiconductor chip 3 and the second semiconductor chip 1b are connected to each other via the first bumps 4a (i.e., CoC connection).

Figure 3C:
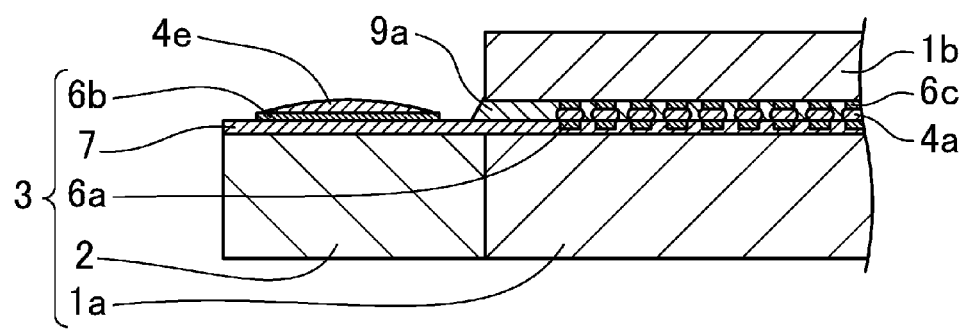

Next, as illustrated in FIG. 3C, a first underfill 9a is injected into a gap between the first bumps 4a, in other words, a gap between the first semiconductor chip 1a and the second semiconductor chip 1b, and the first underfill 9a is cured to adhere the second semiconductor chip 1b to the expanded semiconductor chip 3.

Figure 4A:
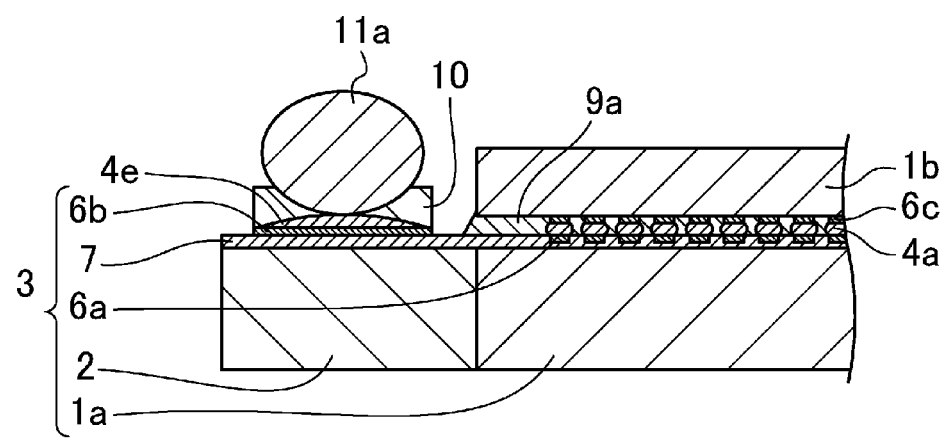
FIG. 4A and FIG. 4B are cross-sections illustrating the method for manufacturing the semiconductor device of the embodiment in the order of steps.

Next, as illustrated in FIG. 4A, a flux 10 is applied onto the fifth bump 4e on the expanded semiconductor chip 3 by a pin transfer method or a printing method, and a first solder ball 11a is placed on the flux 10.

Figure 4B:
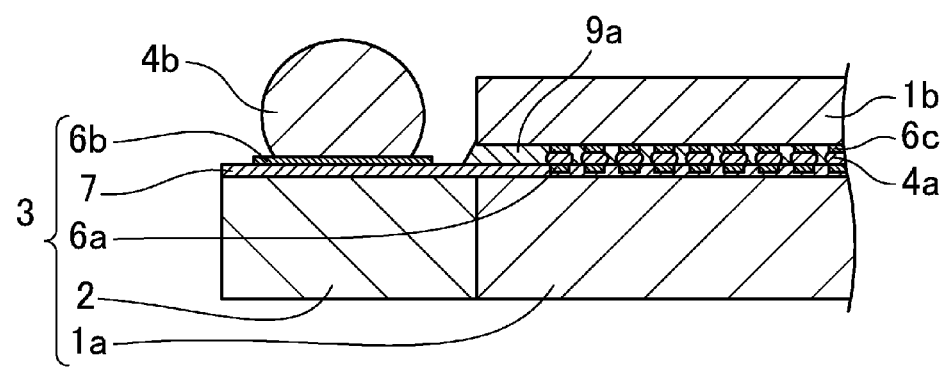

Next, as illustrated in FIG. 4B, the first solder ball 11a is melted by reflow heating, thereby forming a plurality of second bumps 4b (only one bump 4b is shown in FIG. 4B) each of which is connected to a corresponding one of the second electrode pads 6b. In the case where the flux 10 is not of a non-cleaning type, a step (not shown) of cleaning residues of the flux 10 is necessary.

Figure 5:
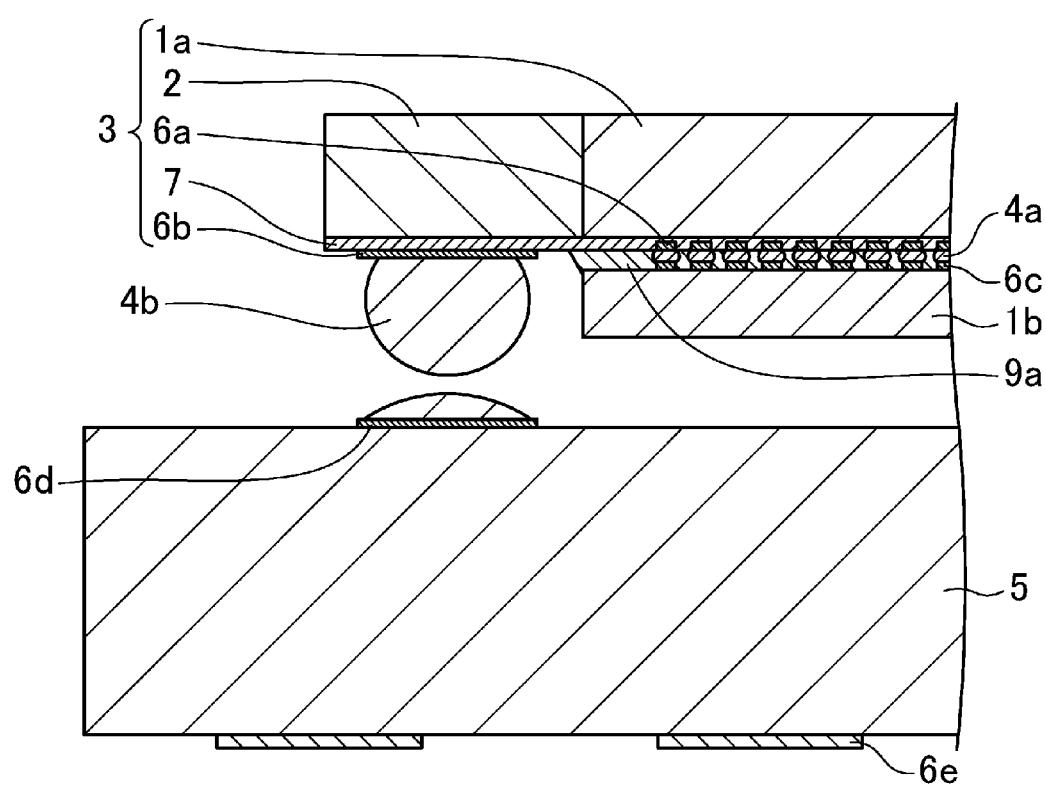
FIG. 5 is a cross-section illustrating a step of the method for manufacturing the semiconductor device of the embodiment.

Next, as illustrated in FIG. 5, a substrate 5 is prepared. A plurality of fourth electrode pads 6d (only one pad 6d is shown in FIG. 5) are formed in advance on a front surface (the upper surface in FIG. 5) of the substrate 5, whereas a plurality of fifth electrode pads 6e for connection with an external device are formed on a back surface (the lower surface in FIG. 5) of the substrate 5. The expanded semiconductor chip 3 is positioned over the substrate 5 such that the second bump 4b provided on the expanded semiconductor chip 3 is aligned with the fourth electrode pad 6d on the substrate 5 at a desired position. Another option may be that a bump is formed on the fourth electrode pad 6d, or a flux may be transferred to the second bump 4b (not shown).

Figure 6:
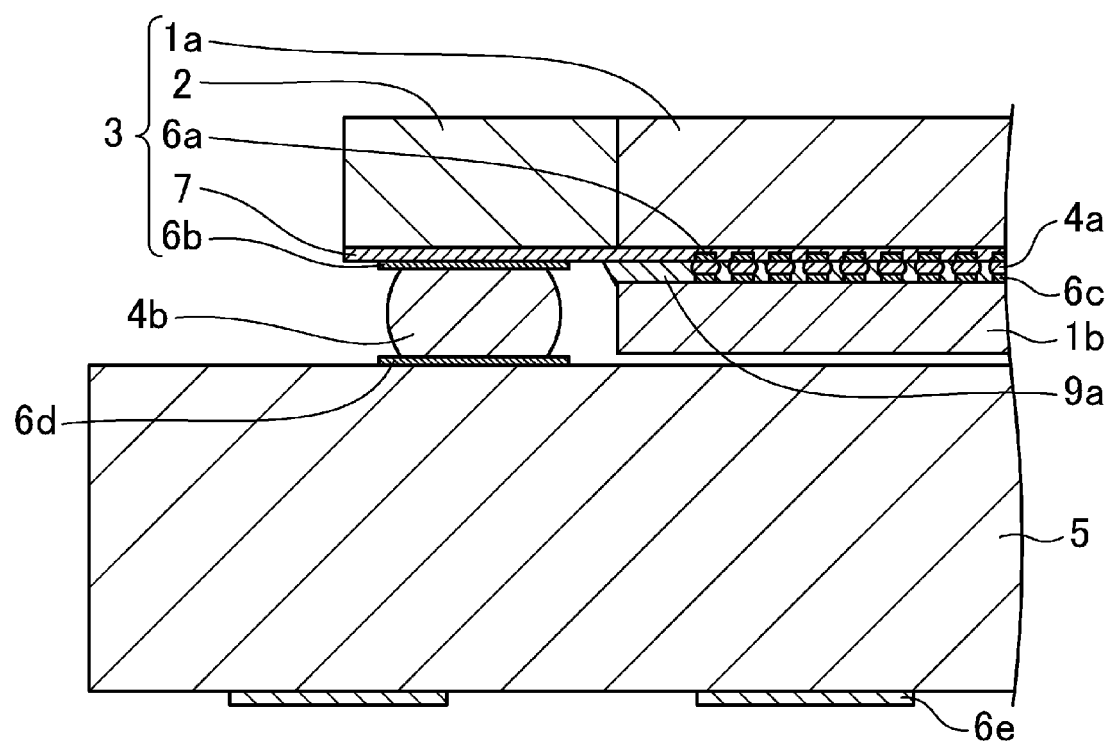
FIG. 6 is a cross-section illustrating a step of the method for manufacturing the semiconductor device of the embodiment.

Next, as illustrated in FIG. 6, the fourth electrode pad 6d and the second bump 4b are connected to each other by heating, e.g., reflow heating or local heating, or pressure welding, thereby connecting the first semiconductor chip 1a and the substrate 5 via the second bump 4b and the re-distribution interconnect portion 7 (i.e., FC connection).

Figure 7:
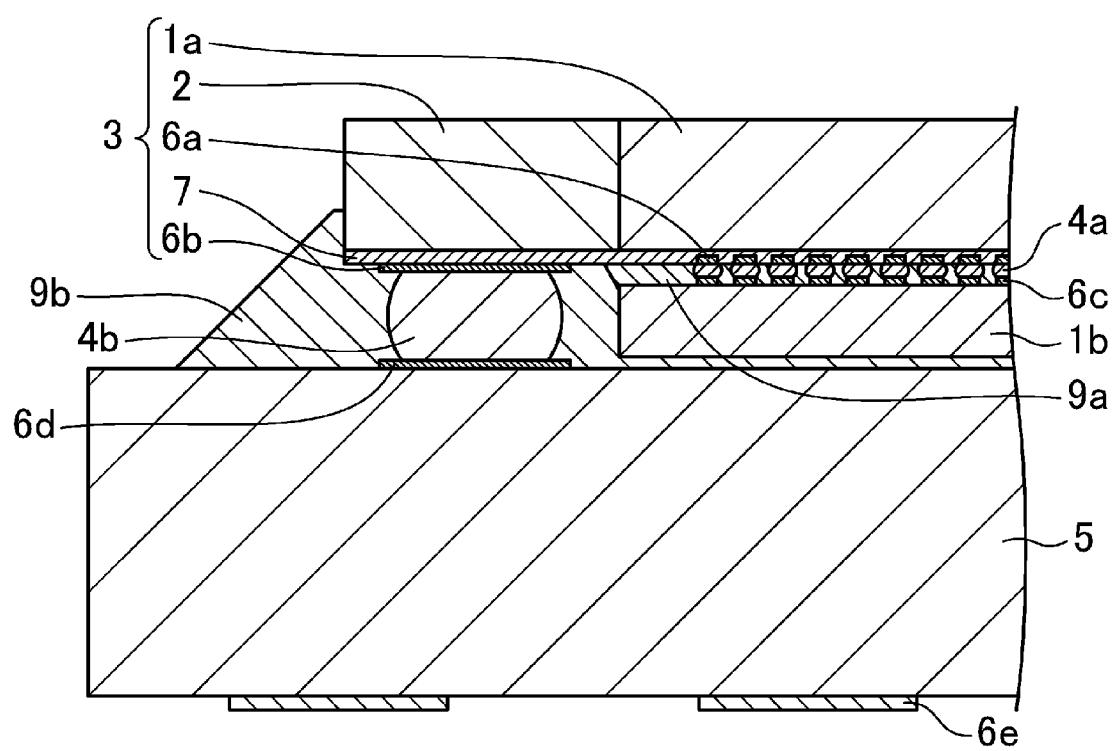
FIG. 7 is a cross-section illustrating a step of the method for manufacturing the semiconductor device of the embodiment.

Next, as illustrated in FIG. 7, a second underfill 9b is injected into a gap between the first bumps 4a, in other words, a gap between the expanded semiconductor chip 3 and the substrate 5, and the second underfill 9b is cured to adhere the expanded semiconductor chip 3 to the substrate 5.

Figure 8:
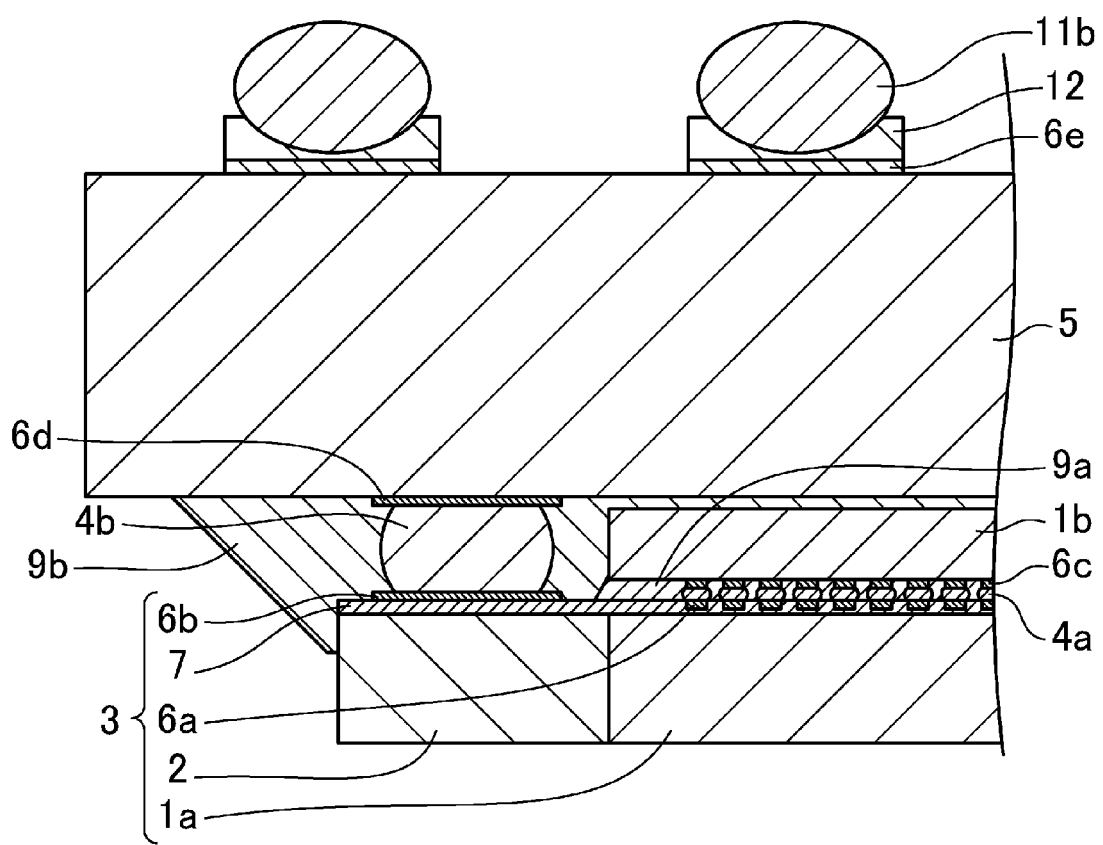
FIG. 8 is a cross-section illustrating a step of the method for manufacturing the semiconductor device of the embodiment.

Next, as illustrated in FIG. 8, a flux 12 is applied onto the fifth electrode pad 6e on the back surface (the upper surface in FIG. 8) of the substrate 5 by a pin transfer method or a printing method, and a second solder ball 11b is placed on the flux 12.

Figure 9:
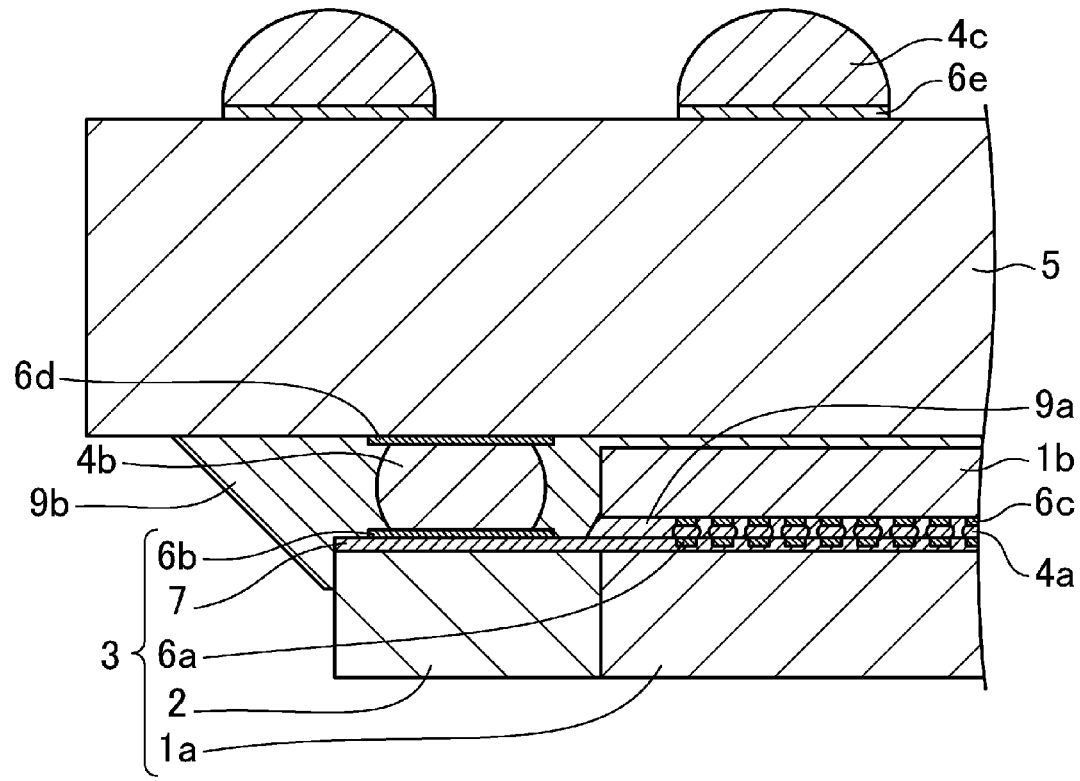
FIG. 9 is a cross-section illustrating a step of the method for manufacturing the semiconductor device of the embodiment.

Next, as illustrated in FIG. 9, the second solder ball 11b is melted by reflow heating, thereby forming a plurality of third bumps 4c each of which is connected to a corresponding one of the plurality of fifth electrode pads 6e. In the case where the flux 12 is not of a non-cleaning type, a step (not shown) of cleaning residues of the flux 12 is necessary.

The semiconductor device of the present embodiment can be obtained by the steps described above.

In the method for manufacturing the semiconductor device according to an embodiment of the present disclosure, semiconductor chips can be stacked with each other by CoC connection and mounted on a substrate by FC connection with no limitation on size of the semiconductor chips.

In the method for manufacturing the semiconductor device of the present embodiment, the first underfill 9a and the second underfill 9b, for example, are injected and cured after the CoC connection and the FC connection. However, the underfills may be applied before the CoC connection and the FC connection. In this case, each of the CoC connection and the FC connection, and the formation of the underfills can be achieved in the same step, and thus, it is possible to reduce the manufacturing steps. Further, in the case where a gap between connected portions which is formed in the connection step (e.g., a gap between the first bumps 4a) is narrow (e.g., about 5 μnm to 40 μm), it is difficult to fill the gap with the underfill. Therefore, applying the underfill before connection improves filling properties.

In FIG. 4A, the first solder ball 11a is placed on the second electrode pad 6b. However, in the case of using a bump made of Au, an Au stud bump may be formed as the first bump 4a by a capillary method. In this case, the reflow step shown in FIG. 4B is not necessary, and it is thus possible to reduce manufacturing steps.

In the present embodiment, a solder ball is used to form the bump, but the solder ball may be replaced with a solder paste applied by a screen printing method.

In the present embodiment, a thickness relationship among the bumps 4a and 4b and the electrode pads 6a, 6b, 6c and 6d is set such that there is no obstacle in flip-chip connecting the expanded semiconductor chip 3 and the substrate 5. That is, the thicknesses may be such that the second semiconductor chip 1b and the substrate 5 are not in contact with each other. Thus, the sum of the thicknesses of the second electrode pad 6b, the second bump 4b, and the fourth electrode pad 6d needs to be larger at least than the sum of the thicknesses of the first electrode pad 6a, the first bump 4a, the third electrode pad 6c, and the second semiconductor chip 1b.

In general, the thickness of each of the electrode pads 6a, 6b, 6c and 6d is about 5 μm to 10 μm, and the thickness of the second semiconductor chip 1b is about 20 μm to 150 μm. This means that each second bump 4b needs to be thick. However, if the thickness of the second bump 4b is increased while pursuing multiple pins and increased density of the second bumps 4b, adjacent bumps may be electrically shorted. The above problem can be avoided by significantly reducing the thickness of the second semiconductor chip 1b. However, for example, if the thickness of the second semiconductor chip 1b is reduced to 100 μm or thinner, the semiconductor chip may be very easily broken due to stress during handling in the manufacturing process, resulting in decreases in yield.

(Variation)

The first to third variations of one embodiment of the present disclosure for solving the above problems will be described with reference to FIG. 10 to FIG. 12.

Figure 10:
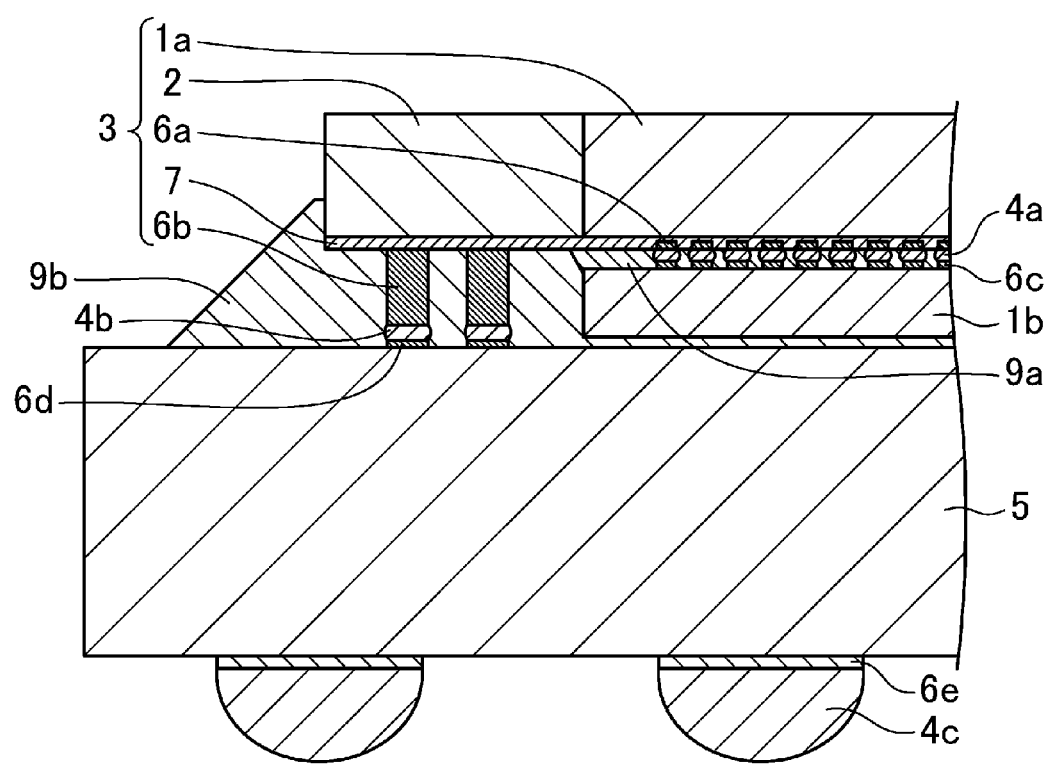
FIG. 10 is a cross-section of a semiconductor device of the first variation of the embodiment.

As illustrated in FIG. 10, in a semiconductor device according to the first variation of the embodiment, the thickness of the second electrode pad 6b is greater than the thickness of the first electrode pad 6a. Specifically, the thickness of the second electrode pad 6b is about 20 μm to 100 μm. This configuration prevents shorts between adjacent bumps, making it possible to achieve multiple pins and increased density of the bumps.

Figure 11:
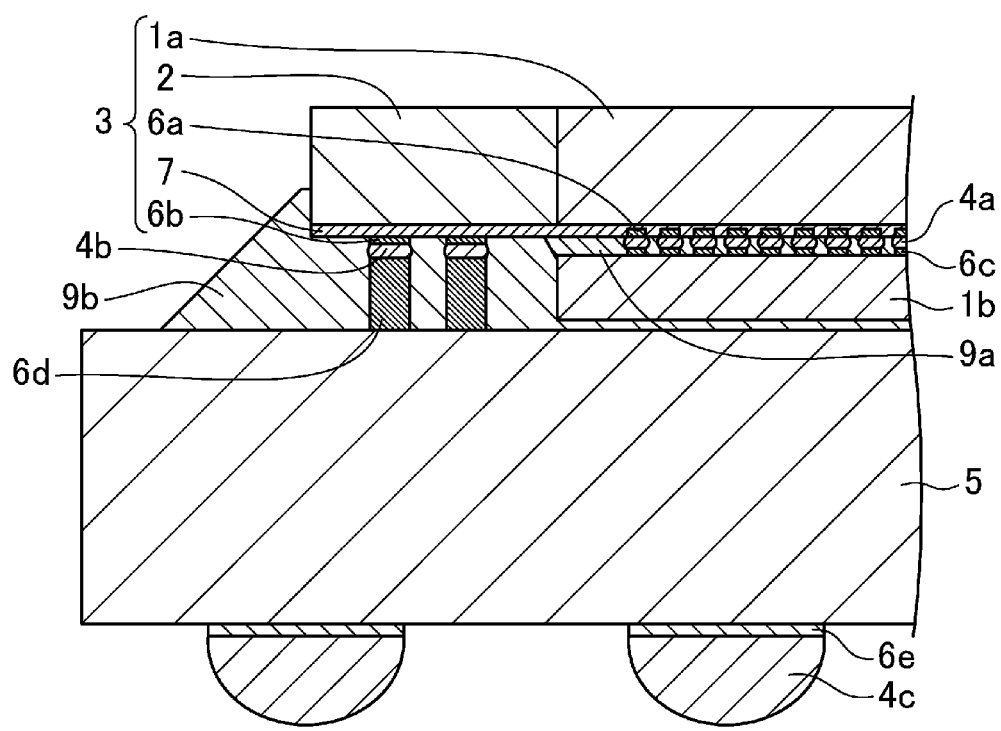
FIG. 11 is a cross-section of a semiconductor device of the second variation of the embodiment.

As illustrated in FIG. 11, in a semiconductor device according to the second variation of the embodiment, the thickness of the fourth electrode pad 6d formed on the substrate 5 is greater at least than a difference between the sum of the thicknesses of the second bump 4b and the second electrode pad 6b, and the thickness of the second semiconductor chip 1b. For example, the thickness of the fourth electrode pad 6d is about 20 μm to 100 μm. Due to this configuration, similar effects as in the first variation can be obtained. Further, since the second electrode pad 6b does not need to have a thickness greater than the thickness of the first electrode pad 6a, the first electrode pad 6a and the second electrode pad 6b can be formed in the same process. As a result, manufacturing costs can be reduced.

The second bumps 4b connecting the expanded semiconductor chip 3 and the substrate 5 may be arranged in multiple lines to achieve multiple pins and increased density of the bumps, as in the first variation and the second variation of the one embodiment. The first bumps 4a located between the expanded semiconductor chip 3 and the second semiconductor chip 1b have a smaller center distance between adjacent bumps (i.e., a smaller bump pitch) than the second bumps 4b located between the expanded semiconductor chip 3 and the substrate 5. Further, the second bumps 4b have a smaller bump pitch than the third bumps 4c provided on one of the surfaces of the substrate 5 which is opposite to the surface connected to the first semiconductor chip 1a. Specifically, the bump pitch of the first bumps 4a is about 20 μm to 50 μm to achieve multiple pins associated with an increase in the bandwidth of the memory chip and an increase in processing speed. The bump pitch of the second bumps 4b is about 40 μm to 200 μm, and the bump pitch of the third bumps 4c is about 400 μm to 1000 μm. Due to these configurations, it is possible to achieve multiple pins associated with an increase in the bandwidth of the memory chip and an increase in processing speed, and the semiconductor device can be preferably mounted on the mother board without using an expensive mother board with fine wiring rules.

Figure 12:
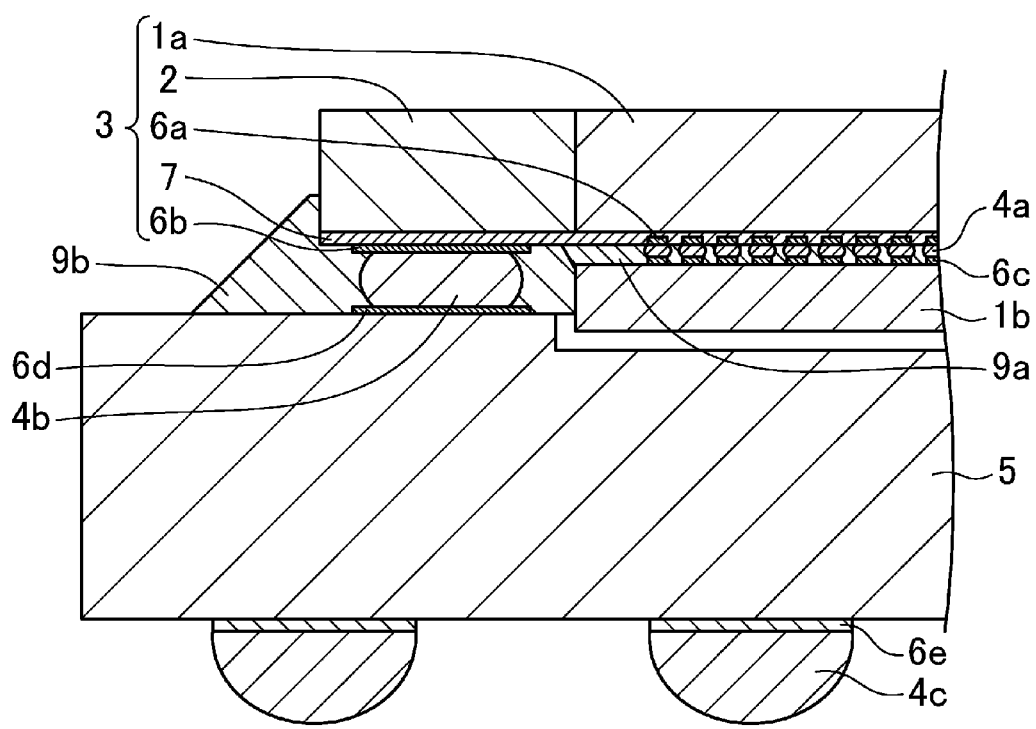
FIG. 12 is a cross-section of a semiconductor device of the third variation of the embodiment.

As illustrated in FIG. 12, in a semiconductor device according to the third variation of the embodiment, a groove is formed in a region of the front surface of the substrate 5 where the second semiconductor chip 1b overlaps. Due to this configuration, similar effects as in the first variation can be obtained. Further, since the second electrode pad 6b does not need to have a thickness greater than the thickness of the first electrode pad 6a, the first electrode pad 6a and the second electrode pad 6b can be formed in the same process. As a result, manufacturing costs can be reduced.

Figure 13:
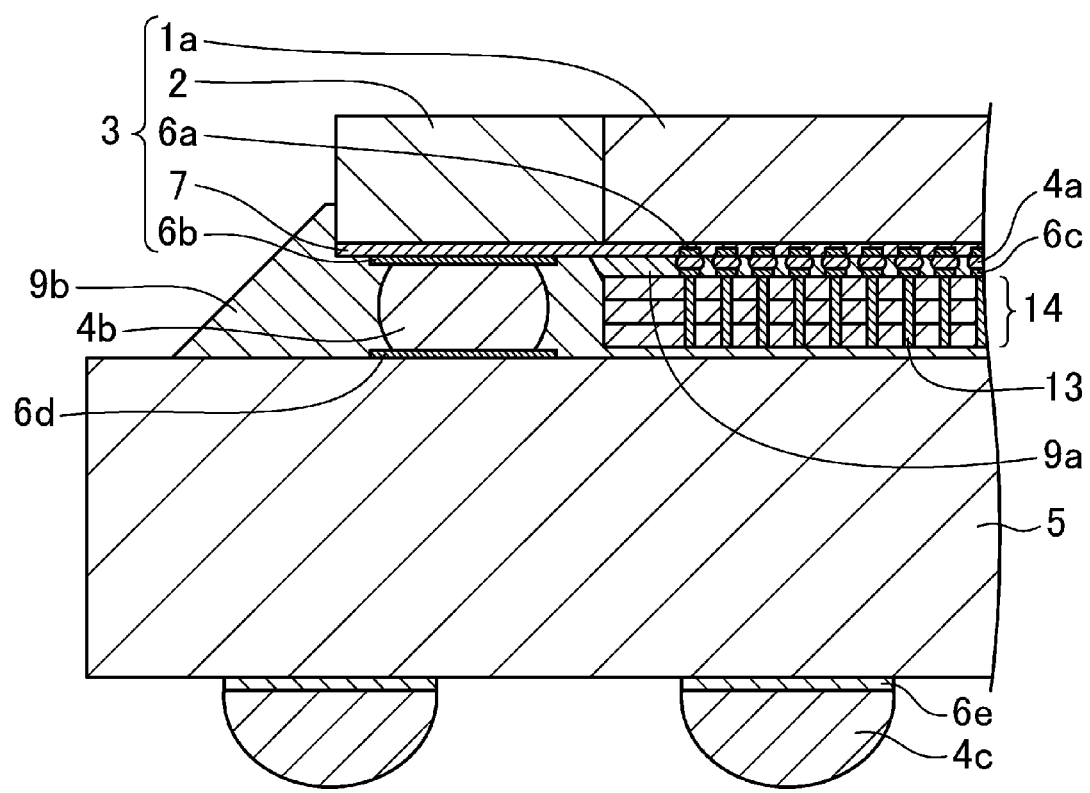
FIG. 13 is a cross-section of a semiconductor device of the fourth variation of the embodiment.

A semiconductor device according to the fourth variation of the embodiment which is intended to increase the capacity of the memory chip will be described with reference to FIG. 13. As illustrated in FIG. 13, stacked chips 14 are used as the second semiconductor chip which is a memory chip. A through electrode 13 is formed in the stacked chips 14 to connect them with one another. This configuration allows the memory chip to have an increased capacity.

As described above, according to the semiconductor device of the present disclosure, semiconductor chips can be stacked with each other by CoC connection and mounted on a substrate by FC connection with no limitation on size of the semiconductor chips, and the present disclosure is especially useful as a semiconductor device having a CoC structure in which a plurality of semiconductor chips are stacked, and a method for manufacturing the semiconductor device.

What is claimed is:

1. A semiconductor device, comprising:
   an expanded semiconductor chip including a first semiconductor chip and an expanded portion which extends outward from a side surface of the first semiconductor chip;
   a second semiconductor chip provided so as to be connected to the expanded semiconductor chip via a plurality of first bumps; and
   a base provided so as to be connected to the expanded semiconductor chip via a plurality of second bumps, wherein
   the first bumps are formed between the first semiconductor chip and the second semiconductor chip,
   the second bumps are formed between a surface of the expanded portion facing the base and a surface of the base facing the expanded portion, and
   both of a first surface of each of the second bumps facing the surface of the expanded portion and a second surface of each the second bumps facing the surface of the base have a flat shape.

2. The semiconductor device of claim 1, wherein
   the expanded semiconductor chip has a re-distribution interconnect portion extending from a front surface of the first semiconductor chip to a front surface of the expanded portion.

3. The semiconductor device of claim 2, wherein
   a first electrode pad to be connected to a corresponding one of the first bumps and a second electrode pad to be connected to a corresponding one of the second bumps are formed in the re-distribution interconnect portion, and
   the first electrode pad and the second electrode pad are connected to each other via an interconnect formed in the re-distribution interconnect portion.

4. The semiconductor device of claim 3, wherein
   the re-distribution interconnect portion includes a plurality of layers.

5. The semiconductor device of claim 3, wherein
   the second semiconductor chip includes a third electrode pad connected to a corresponding one of the first bumps,
   the base includes a fourth electrode pad connected to a corresponding one of the second bumps, and
   a sum of thicknesses of the second electrode pad, the corresponding one of the second bumps, and the fourth electrode pad is larger than a sum of thicknesses of the first electrode pad, the corresponding one of the first bumps, the third electrode pad, and the second semiconductor chip.

6. The semiconductor vice of claim 5, wherein
   the thickness of the fourth electrode pad is greater than a difference between a thickness of the second semiconductor chip and a sum of the thickness of the second electrode pad and the thickness of the corresponding one of the second bumps.

7. The semiconductor device of claim 3, wherein the second electrode pad is thicker than the first electrode pad.

8. The semiconductor device of claim 2, wherein
the re-distribution interconnect portion is not formed at a connection portion where the first semiconductor chip and the second semiconductor chip are connected to each other via the first bumps, and
the first semiconductor chip and the second semiconductor chip are connected to each other, not via the interconnect formed in the re-distribution interconnect portion.

9. The semiconductor device of claim 2, wherein
a length of each side of the front surface of the expanded semiconductor chip is longer than a length of each side of a front surface of the second semiconductor chip.

10. The semiconductor device of claim 2, wherein
the base has a plurality of external terminals on a surface opposite to a surface facing the expanded semiconductor chip, and
a distance between adjacent ones of the second bumps is greater than a distance between adjacent ones of the first bumps, and is smaller than a distance between adjacent ones of the external terminal.

11. The semiconductor device of claim 2, wherein
the second semiconductor chip is a stacked-type chip including a plurality of semiconductor chips stacked one another, and the stacked semiconductor chips are connected with one another by a through electrode.

12. The semiconductor device of claim 1, wherein
a length of each side of the front surface of the expanded semiconductor chip is longer than a length of each side of a front surface of the second semiconductor chip.

13. The semiconductor device of claim 1, wherein
the expanded portion is made of a resin material covering the side surface of the first semiconductor chip.

14. The semiconductor device of claim 1, wherein
the base has a plurality of external terminals on a surface opposite to a surface facing the expanded semiconductor chip, and
a distance between adjacent ones of the second bumps is greater than a distance between adjacent ones of the first bumps, and is smaller than a distance between adjacent ones of the external terminals.

15. The semiconductor device of claim 1, wherein
a groove is formed in a region of the base where the second semiconductor chip overlaps, in a surface facing the second semiconductor chip.

16. The semiconductor device of claim 1, wherein
the second semiconductor chip is a stacked-type semiconductor chip including a plurality of semiconductor chips stacked one another, and the stacked semiconductor chips are connected with one another by a through electrode.

17. The semiconductor device of claim 1, wherein the second bumps are disposed under the expanded portion.

* * * * *